United States Patent
Huang et al.

(10) Patent No.: US 9,927,675 B2
(45) Date of Patent: Mar. 27, 2018

(54) TERAHERTZ MODULATOR BASED ON LOW-DIMENSION ELECTRON PLASMA WAVE AND MANUFACTURING METHOD THEREOF

(71) Applicant: SUZHOU INSTITUTE OF NANO-TECH AND NANO-BIONICS(SINANO), CHINESE ACADEMY OF SCIENCES, Suzhou (CN)

(72) Inventors: Yongdan Huang, Suzhou (CN); Hua Qin, Suzhou (CN); Zhipeng Zhang, Suzhou (CN); Yao Yu, Suzhou (CN)

(73) Assignee: SUZHOU INSTITUTE OF NANO-TECH AND NANO-BIONICS (SINANO), CHINESE ACADEMY OF SCIENCES, Suzhou (CN)

( * ) Notice: Subject to any disclaimer, the term of this patent is extended or adjusted under 35 U.S.C. 154(b) by 0 days.

(21) Appl. No.: 15/317,669

(22) PCT Filed: Jun. 9, 2015

(86) PCT No.: PCT/CN2015/081026
§ 371 (c)(1),
(2) Date: Dec. 9, 2016

(87) PCT Pub. No.: WO2015/188736
PCT Pub. Date: Dec. 17, 2015

(65) Prior Publication Data
US 2017/0108756 A1     Apr. 20, 2017

(30) Foreign Application Priority Data

Jun. 10, 2014 (CN) .......................... 2014 1 0256651

(51) Int. Cl.
*G02F 1/21*         (2006.01)
*H01L 29/20*      (2006.01)
(Continued)

(52) U.S. Cl.
CPC ............ *G02F 1/21* (2013.01); *H01L 21/0254* (2013.01); *H01L 21/28575* (2013.01);
(Continued)

(58) Field of Classification Search
CPC .. G02F 1/21; G02F 2001/213; G02F 2203/13; H01L 29/66462; H01L 21/3065;
(Continued)

(56) References Cited

U.S. PATENT DOCUMENTS

2008/0315216 A1\* 12/2008 Otsuji ..................... H01S 1/02
                                                           257/83
2014/0197896 A1\* 7/2014 Ouchi ..................... H03B 7/08
                                                          331/107 T
2015/0001548 A1\* 1/2015 Okamura ................ H01L 33/58
                                                          257/76

\* cited by examiner

*Primary Examiner* — Roy Potter
*Assistant Examiner* — Paul Patton
(74) *Attorney, Agent, or Firm* — Goldilocks Zone IP Law

(57) ABSTRACT

A terahertz modulator based on low-dimension electron plasma wave, a manufacturing method thereof, and a high speed modulation method are provided. The terahertz modulator includes a plasmon and a cavity. The present disclosure discloses the resonance absorption mechanism caused by collective oscillation of electrons (plasma wave, namely, the plasmon). In order to enhance the coupling strength between the terahertz wave and the plasmon, a GaN/AlGaN high electron mobility transistor structure having a grating gate is integrated in a terahertz Fabry-Pérot cavity, and a plasmon polariton is formed arising from strong coupling of the plasmon and a cavity mode.

19 Claims, 7 Drawing Sheets

(51) Int. Cl.
*H01L 29/205* (2006.01)
*H01L 29/778* (2006.01)
*H01L 21/02* (2006.01)
*H01L 29/66* (2006.01)
*H01L 21/78* (2006.01)
*H01L 21/285* (2006.01)
*H01L 29/45* (2006.01)
*H01L 21/3065* (2006.01)

(52) U.S. Cl.
CPC .......... *H01L 21/3065* (2013.01); *H01L 21/78* (2013.01); *H01L 29/2003* (2013.01); *H01L 29/205* (2013.01); *H01L 29/452* (2013.01); *H01L 29/66462* (2013.01); *H01L 29/7787* (2013.01); *G02F 2001/213* (2013.01); *G02F 2203/13* (2013.01)

(58) Field of Classification Search
CPC . H01L 29/452; H01L 21/28575; H01L 21/78; H01L 29/2003; H01L 21/0254; H01L 29/7787; H01L 29/205
See application file for complete search history.

TERAHERTZ MODULATOR BASED ON LOW-DIMENSION ELECTRON PLASMA WAVE AND MANUFACTURING METHOD THEREOF

CROSS REFERENCE TO RELATED PATENT APPLICATIONS

This application claims the benefit under 35 U.S.C. Section 371, of PCT International Application No. PCT/CN2015/081026, filed Jun. 9, 2015, which claimed priority to Chinese Patent Application No. 201410256651.7, filed Jun. 10, 2014, the disclosures of which are hereby incorporated by the references.

TECHNICAL FIELD

The present disclosure relates to a terahertz modulator and a manufacturing method thereof, and particularly relates to a terahertz modulator based on low-dimension electron plasma wave, which is capable of achieving high modulation speed and large modulation depth, and a manufacturing method thereof. The present disclosure also relates to a modulation method based on the terahertz modulator.

BACKGROUND ART

The terahertz wave is of great importance in the application in fields such as electronics, communication, life science, national defense, aerospace, medical industry, and so forth. The terahertz functional devices are the essential parts in a terahertz system. In a terahertz high-speed imaging and communication system, a high-performance modulator plays an importance role. Nowadays, the development and application of electrically driven terahertz modulator with high modulation speed and large modulation depth have been hindered due to its absence in global industry.

The technical solution of the existing solid terahertz modulator mainly refers to the mechanism of non-resonance absorption of terahertz wave caused by the changes of Drude conductivity based on single-electron behavior. The modulator can be achieved mainly by the following materials: semiconductor two-dimensional electron gas, semiconductor hybrid metamaterial, graphene, and so forth.

Regarding the modulator achieved by two-dimensional electron gas, the conductivity thereof can be changed by electrically controlling the concentration of the two-dimensional electron gas through a gate, so as to change a transmission intensity of an incident terahertz radiation. The above method can be performed at an ambient temperature, while the maximum modulation depth thereof is only 3%, which can be hardly promoted in actual application. Such type of modulator does not utilize characteristics of plasma wave. The principle is that the transmission intensity of terahertz wave is related to the conductivity of the two-dimensional electron gas.

Regarding the modulator achieved by semiconductor hybrid metamaterial, the metamaterial is an artificial media constituted by structural units ("atoms") smaller than wavelengths of excitation electromagnetic wave and having electromagnetic resonance response. When manufacturing the semiconductor hybrid metamaterial, adjustments can be made in terms of the geometric design and the electromagnetic structural parameters of the metamaterial in order to change the resonant characteristics thereof. Based on such principle, an effective manipulation of the terahertz radiation can be achieved. A Schottky diode structure is formed by manufacturing metamaterial on a doped semiconductor epitaxial layer, and the resonance intensity can be changed by tuning the carrier concentration of a semiconductor substrate layer near a gap of a split-ring resonator (SRR) structural unit through voltage, thus the transmission intensity of the terahertz wave at the resonance frequency can be controlled electrically. The above method can achieve a modulation depth of 50% and a modulation speed of 2 MHz at an ambient temperature. In another hybrid metamaterial structure, the high electron mobility transistor (HEMT) is integrated at the gap of the SRR, and the capacitance of the SRR can be changed by tuning the electron concentration in the channel through the gate, in order to adjust the resonance intensity of the SRR. The modulation depth of the device can reach 33%, and the highest modulation speed can reach 10 MHz. In the terahertz band, the existing patents of modulator are mainly achieved by using metamaterial, such as the US patent with the title of "Active Terahertz Metamaterial Device" filed by Houtong Chen et al in 2009.

Regarding the modulator achieved by graphene, in the terahertz band, the intraband transition of electrons in the graphene plays the major role, while a modulation depth of 15% and a modulation frequency of 20 kHz can be achieved at an ambient temperature by using a single-layer graphene having a large area.

The major defects of the prior art mainly include:

in the prior art, the modulation depth is generally low, and may only reach as high as 50%, which means that the energy dissipation of the above mechanisms are not very effective; in addition, high speed modulation is one of the most important performance metrics of the modulator, while the modulation speed of the prior art is not high (the highest modulation speed is 10 MHz).

The underlying causes of these defects mainly include: a) the carrier layers of the two-dimensional electron gas and the graphene are very thin, the electromagnetic wave interacts with the carrier for a short period of time, and if a strong coupling is not achieved, the modulation efficiency will not be high; b) the dissipation of a Drude conductivity model originates from single free carrier scattering by external environment (phonons, impurities and defects, etc.), and the electromagnetic wave is coupled with single-particle, hence such dissipation mechanism of the terahertz wave is not very effective; c) the modulation speed of a device with a large active area is limited by a parasitic capacitance and resistance, such as the depletion layer capacitance and resistance formed by applying gate voltage in a semiconductor hybrid metamaterial, of the device.

So far the relevant papers and reports on achieving terahertz modulator using low-dimension electron plasma wave is not yet published.

SUMMARY

The technical problem to be solved by the present disclosure is to provide a terahertz modulator which can realize high modulation speed and large modulation depth, and can realize a highly efficient modulation on the terahertz wave enabled by a plasmon polariton formed through strong coupling of a terahertz wave cavity mode and a plasma wave mode. A possible solution is provided for a modulator necessary for achieving terahertz high-speed imaging and high-speed communication.

The terahertz modulator of the present disclosure includes a plasmon and a cavity; wherein
the plasmon includes:
a GaN/AlGaN high electron mobility transistor including:
a source electrode, a drain electrode and a grating gate;
a quasi-two-dimensional electron layer formed on the side of a narrow bandgap semiconductor at a semiconductor heterojunction of the transistor, for exciting plasma wave,
wherein the cavity includes a dielectric cavity formed from a surface where a grating contacts with a sample to a lower surface of a thinned sapphire substrate.

The terahertz modulator as mentioned above, wherein the grating gate is a one-dimensional grating or an interdigital grating.

The terahertz modulator as mentioned above, wherein the cavity can be a Fabry-Pérot (F-P) cavity formed by interfaces of the thinned sample itself or can be a symmetrical cavity structure formed by identical dielectric layers.

The present disclosure also proposes a high-speed modulation method based on the high electron mobility transistor, which includes:
grounding the source electrode and the drain electrode of the transistor, supplying a negative DC gate voltage $V_G$ and an AC modulation signal to the gate electrode of the transistor, wherein the signal amplitude is $V_M$;
the transistor comprising a grating gate for strongly coupling the terahertz cavity mode to the two-dimensional plasma wave in the two-dimensional electron gas to form the plasmon polariton;
a grating gate voltage being tuned to meet the conditions when the plasmon is resonant with the cavity mode;
the gate voltage being switched between the resonant and non-resonant conditions to achieve effective modulation on the cavity mode.

The high-speed modulation method as mentioned above, wherein a resonant frequency of the plasmon depends on an electron concentration $n_s$, a wave vector q and an effective dielectric constant $\overline{\varepsilon}$, that is $$\omega_p = \sqrt{\frac{n_s e^2}{2m^* \varepsilon_0 \overline{\varepsilon}} q_m}, \quad q_m = m\frac{\pi}{W}$$

(W is the gate length, m=1, 2, 3 . . . ).

The high-speed modulation method as mentioned above, wherein the Fabry-Pérot (F-P) cavity mode is related to the refractive index $\overline{n}$ and the thickness D of the cavity material, and the resonant frequency thereof is $$\omega_c = k\frac{\pi c}{\overline{n}D},$$

k=1, 2, 3, . . . .

Wherein when the plasmon and the cavity mode are strongly coupled through resonance, two branches of the plasmon polariton appear, which is a major feature of strong coupling.

The present disclosure further proposes a method of manufacturing the terahertz modulator, including:
I. forming a two-dimensional electron-gas mesa of an active region of the device on a GaN/AlGaN two-dimensional electron-gas die;
II. forming source and drain ohmic contacts;
III. forming a grating gate;
IV. forming lead electrodes of grating gate and ohmic contact and pattern transfer for wafer bonding;
V. thinning and polishing the back side of the sapphire substrate to form a cavity structure.

The present disclosure further discloses a method of manufacturing a terahertz modulator having a symmetrical dielectric cavity, including steps of manufacturing a dielectric cavity and bonding the dielectric cavity and the two-dimensional electron-gas chip together, wherein the step of manufacturing the dielectric cavity includes: thinning and polishing the cavity flat plate material; performing pattern transfer of wafer bonding region on the cavity flat plate material; and achieving transfer of flip-chip bonding pattern at a bonding metal region.

The present disclosure has notable features, since the plasma wave in the two-dimensional electron gas represent the collective oscillation of electrons, and the intrinsic strong bound electric field can achieve strong coupling with the terahertz wave, hence achieving high efficiency in modulating the terahertz wave. As opposed to the dissipation mechanism of single electron behavior, the dissipation of collective oscillation mode of the present disclosure is more effective, which may facilitate the realization of large modulation depth. The plasma wave of the two-dimensional electron gas are integrated in the terahertz cavity to achieve strong coupling, and a highly efficiency modulation on a resonant mode of the cavity is achieved by controlling the plasmon.

The present disclosure realizes a highly efficient modulation on the terahertz wave by using a plasmon polariton formed through strong coupling of a terahertz wave cavity mode and a plasma wave mode. A high modulation speed (about 1 GHz) and large modulation depth (70%, namely, above 10 dB) can be achieved, and a possible solution is provided for a modulator necessary for achieving terahertz high-speed imaging and high-speed communication.

BRIEF DESCRIPTION OF THE DRAWINGS

FIG. 2 is a schematic of a grating gate in the terahertz modulator of the present disclosure, wherein FIG. 2a shows a one-dimensional grating gate, and FIG. 2b shows an interdigital grating gate;

DETAILED DESCRIPTION OF EXEMPLARY EMBODIMENTS

Figure 1:
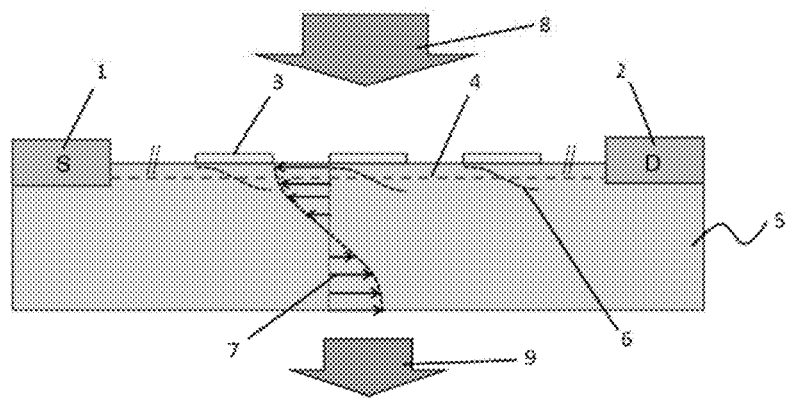
FIG. 1 is a schematic of a structure principle of a terahertz modulator of the present disclosure.

In order to make the purpose, technical solution and advantages of the present disclosure to be more clear and understood, the embodiments of the present disclosure will be explained in detail below in conjunction with the drawings.

For clarity to those skilled in the art, the relevant terms provided in the present disclosure are interpreted as follows.
1) Terahertz wave (Terahertz radiation): a terahertz wave refers to an electromagnetic wave with a frequency range of 0.1-10 THz (1 THz=1000 GHz=$10^{12}$ Hz) or a wavelength range of 30 µm to 3 mm, which falls between a millimeter wave band and an infrared wave band, and is also called a submillimeter wave or far infrared.
2) Terahertz modulator: a terahertz modulator refers to a device or equipment capable of effectively modulating an electromagnetic characteristic (electric field strength or phase) of the terahertz wave.
3) Terahertz cavity: a terahertz cavity refers to an electromagnetic dielectric structure capable of supporting specific standing wave modes of terahertz wave, which include a metal waveguide cavity and a dielectric waveguide cavity. A Fabry cavity also belongs to the metal waveguide cavity or the dielectric waveguide cavity, which is filled with a low-loss dielectric material or vacuum (air), and a surface of the cavity can be a metal coating having a high reflectivity or a dielectric-air interface.
4) Two-dimensional electron gas (2DEG): the two-dimensional electron gas refers to an electronic system having a certain density, the movement of which is limited in one dimension of space, but is free in the other two dimensions. In solid materials, a quasi-two-dimensional electron layer is generally formed on a side of a narrow bandgap semiconductor at a semiconductor heterojunction, such as the two-dimensional electron gas on a GaAs side of a GaAs/AlGaAs heterojunction interface and the two-dimensional electron gas on a GaN side of a GaN/AlGaN heterojunction interface. The electrons in the two-dimensional electron gas in the heterojunction can be spatially separated from the doped impurities effectively, hence the two-dimensional electron gas has a higher mobility than that of carriers in the corresponding semiconductor bulk material.
5) Plasma wave (Plasmon): a plasma wave refers to a density oscillation generated by a collection of charges having the same polarity under a background of charges having the opposite polarity, which has characteristics of a wave, and is a collective excitation of charges. The quasi particle of the plasma wave oscillation is plasmon, which actually refers to the elementary excitation of charge density oscillation. Here it is referred to as a charge density wave in a semiconductor two-dimensional electron gas, which is called as a two-dimensional plasma wave or a two-dimensional plasmon.
6) Plasmon polariton: a plasmon polariton refers to a coherent mixed state formed by strong coupling of cavity photon and matter elementary excitation. Here it is referred to as a mixed state formed by strong coupling of the plasmon in the two-dimensional electron gas and the cavity mode of the terahertz cavity, which is the eigenstate of the strong coupling system, and is characterized in its anti-cross feature when the plasmon resonates with the cavity mode.
7) High Electron Mobility Transistor (HEMT): a high electron mobility transistor refers to a field-effect transistor manufactured by semiconductor heterojunction material, and since the electrons are separated from a doping region, the electrons in the transistor channel have a very high mobility, hence the transistor is called as the high electron mobility transistor.
8) Amplitude modulation depth: an amplitude modulation depth refers to a percentage value of a ratio between a variation $\Delta A$ of an electric field amplitude of electromagnetic wave and an amplitude A of an original electric field, namely, $\eta = \Delta A/A \times 100\%$.

The present disclosure proposes a terahertz modulator, and its basic principle is the resonance absorption mechanism caused by collective oscillation of electrons (plasmon, or plasma wave). In order to enhance a coupling strength between the terahertz wave and the plasmon, the HEMT structure having grating coupled two-dimensional electron gas is integrated in the terahertz cavity, thereby proposing a terahertz modulator. The terahertz modulator of the present disclosure achieves the smallest transmission coefficient of the cavity mode at a resonance frequency by using the strong coupling effect, and when the oscillation frequency of the plasmon is tuned to allow the system to switch between the resonance and non-resonant conditions, an effective modulation on the cavity resonance mode can be realized.

FIG. 1 shows the structure of the fundamental terahertz modulator device, which mainly includes a plasmon and a cavity.

The plasmon includes:
an GaN/AlGaN HEMT structure having a grating gate, including a source electrode 1, a drain electrode 2 and a grating gate 3;
a quasi-two-dimensional electron layer formed on a side of the narrow bandgap semiconductor at a semiconductor heterojunction, namely, a two-dimensional electron gas 4, which is a carrier of a plasma wave 6, in other words, it is used for exciting plasma wave.

The cavity is a dielectric cavity 5 formed by a thinned sapphire dielectric material. Preferably, the present disclosure adopts the sapphire material processed through thinning as the dielectric material of the cavity.

Specifically speaking, the cavity should include a dielectric cavity formed from a surface where a grating contacts with a sample to a lower surface of the substrate. A very thin gate barrier layer is formed above the two-dimensional electron gas 4, which is also included in the cavity, and the main reason is that this layer is very thin, and a refractive index thereof is very close to that of the substrate, thus said layer can also be called the dielectric cavity.

Wherein the source electrode 1 and the drain electrode 2 can be achieved using traditional ohmic contact process, and it is preferable to minimize its contact resistance thereof.

Wherein as for the two-dimensional electron gas formed on a GaAs side of a GaAs/AlGaAs heterojunction interface and the two-dimensional electron gas formed on a GaN side of a GaN/AlGaN heterojunction interface, there are two essential parameters. The first parameter is high electron mobility. The higher the mobility is, the higher a quality factor of the plasma wave will become, thereby achieving stronger coupling. Generally speaking, regarding the GaN/AlGaN two-dimensional electron gas, a room temperature mobility thereof is at an order of 2000 $cm^2$/Vs. The highest temperature of a plasmon resonance absorption observable in experiments is close to 200K. In order to form an effective plasmon oscillation, the electron mobility should be at the order of 10000 $cm^2$/Vs or above. The second parameter is high density of two-dimensional electron gas. The higher the density is, the better the chance of acquiring a higher quality factor is, and in the case of the same other conditions, the higher the oscillation frequency will become, hence the device can cover a broader spectral range.

Other two-dimensional electron-gas materials include: GaAs/AlGaAs, InGaAs/AlGaAs, graphene, $MoS_2$ and so on.

FIG. 1 further shows that: via the near-field enhancement of the grating, a cavity mode electric field 7 is coupled with a bound electric field of plasma wave 6, which can achieve strong coupling.

In order to increase the coupling strength and the modulation depth, the two-dimensional electron gas in the ungated region in the structure as shown in FIG. 1 can be etched, and the etching can be achieved through, for example, an inductive coupled plasma (ICP).

In FIG. 1, drawing reference number 8 indicates an incident terahertz wave, and drawing reference number 9 indicates a transmitted terahertz wave which has passed through the terahertz modulator.

Figure 2:
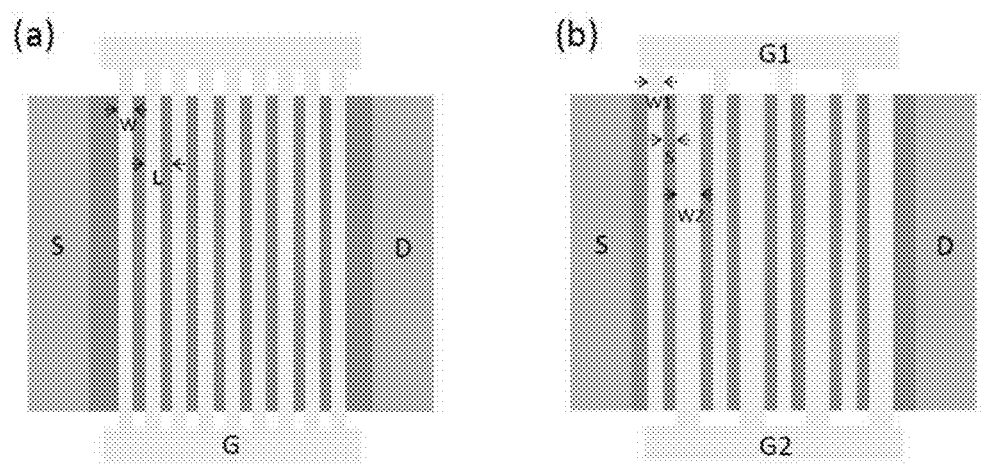

FIG. 2 shows two embodiments about the grating gate in the terahertz modulator of the present disclosure.

FIG. 2a shows a one-dimensional grating, wherein a source electrode of the device is S, a drain electrode is D, a gate electrode is represented by G. A gate length is W, and L indicates a grating period, which equals to a sum of the gate length and a gate slit.

FIG. 2b shows a interdigital grating, wherein a gate length of a grating G1 is W1, a gate length of a grating G2 is W2, and a gate slit is S.

It should be noted that: the grating functions for coupling, and on one hand, its period thereof must be far smaller than a terahertz wavelength (grating period $L \leq \lambda_{THz}/100$), on the other hand, the loss of the grating in terahertz band is very low, then the thickness of metal grating is required to be larger than the skin depth 120 nm).

A function of the grating gate lies in: tuning a plasma wave by applying a gate voltage to the grating.

In addition to the above one-dimensional grating and interdigital metal grating, the grating gate further includes a planar two-dimensional grid grating, a concentric circular grating, a terahertz metamaterial and a periodic structure or pattern of a two-dimensional electron-gas mesa.

The cavity structure of FIG. 1 adopts the simplest substrate, which belongs to a fundamental plate-type cavity. Thus, the present disclosure further proposes a symmetrical cavity structure constituted by a substrate and another piece of equivalent dielectric having the same thickness as shown in FIG. 3.

Regarding the above dielectric cavity, the dielectric material absorbing little terahertz wave is selected, which can also meet the demand of growth of high electron mobility two-dimensional electron-gas heterostructure material. Regarding the GaN/AlGaN material, the sapphire substrate absorbs less terahertz wave and has high mechanical strength, which can be preferably processed into a cavity with smaller size. Generally speaking, the size of the cavity is required to be at the order of the wavelength in a considered frequency band, so that discrete cavity modes can be formed.

Figure 3:
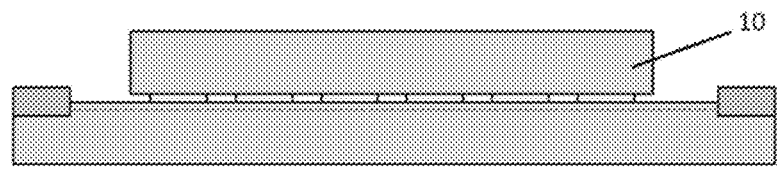
FIG. 3 is a schematic of a structure of a symmetrical cavity in the terahertz modulator of the present disclosure.

In addition to the Fabry-Pérot plate-type cavity of FIG. 3, a cavity which is co-planar to the two-dimensional electron gas can also be provided, such as a terahertz co-planar waveguide (CPW), a slot antenna, a terahertz metamaterial resonator and so forth.

The quasi-two-dimensional electron layer refers to the electrons in the semiconductor two-dimensional electron channel, and a resonance absorption of the terahertz wave is achieved by using the collective oscillation of the electrons, and thus the absorption is further enhanced through a strong coupling with the cavity mode.

Based on the principle of two-dimensional plasma wave resonance absorption, a resonance absorption of the terahertz wave is achieved by using the collective oscillation of the electrons in the two-dimensional electron channel, and the absorption is further enhanced through a strong coupling with the cavity mode. The mentioned physical mechanism is the essence of the present disclosure.

FIGS. 4-8 specify the high-speed modulation method based on a high electron mobility transistor as proposed in the present disclosure.

Figure 4:
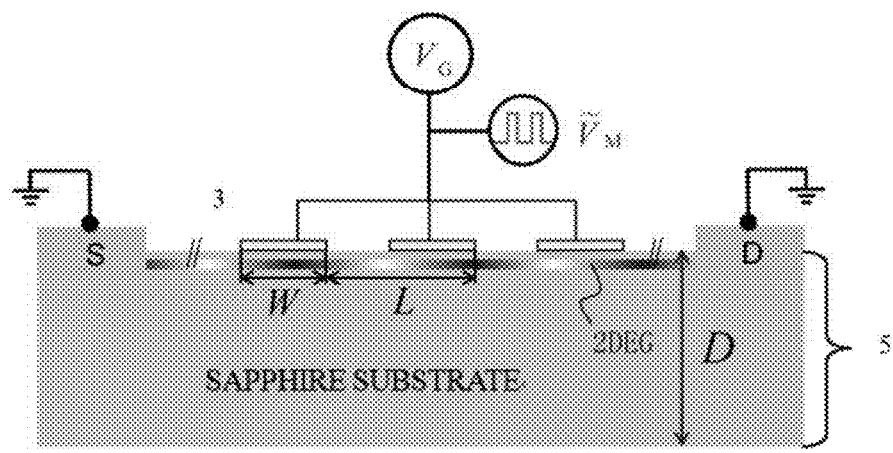
FIG. 4 is a schematic of biasing of respective electrodes in a work state of the terahertz modulator of the present disclosure.

FIG. 4 shows a voltage biasing during an operation of the terahertz modulator of the present disclosure, and as shown in FIG. 4, it is a GaN/AlGaN high electron mobility transistor (HEMT) structure having a grating gate.

The modulation principle of the terahertz modulator of the present disclosure is: the grating strongly couples the terahertz cavity mode and the plasma wave in the two-dimensional electron gas to form the plasmon polariton. The resonance condition of the plasmon and the cavity mode is tuned through a grating gate voltage, and the system is allowed to be switched between the resonance and non-resonance conditions to realize an effective modulation on the terahertz cavity mode.

During an operation of the terahertz modulator device, the source electrode and the drain electrode are connected to the ground, and a negative DC gate voltage $V_G$ and an AC modulation signal (amplitude being $V_M$) are supplied to the gate electrode, as shown in FIG. 4. The resonant frequency of the plasmon depends on the electron concentration $n_s$, a wave vector q and an effective dielectric constant $\bar{\varepsilon}$ (screening effect), that is, $$\omega_p = \sqrt{\frac{n_s e^2}{2m^* \varepsilon_0 \bar{\varepsilon}} q_m}, \quad q_m = m \frac{\pi}{W}$$

(W is the gate length, m=1, 2, 3 . . . ). The electron concentration is tuned by the gate voltage, a relationship between the electron concentration and the gate voltage obtained by the gradual channel approximation in the device physical model is $n_s = C(V_G + V_G - V_{th})/e$, $$C = \frac{\varepsilon_0 \varepsilon_{AlGaN}}{d}$$

Figure 5:
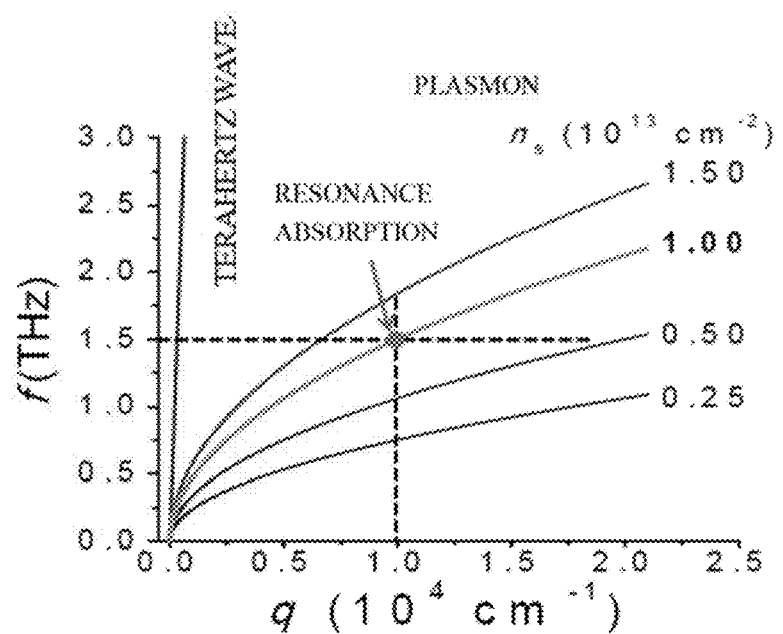
FIG. 5 shows curves of the dispersion relationships of the plasmon and free space terahertz wave.

(wherein $V_{th}$ is a threshold voltage where the electron concentration is depleted, C is a unit capacitance of the gate electrode, $\varepsilon_0$ is a vacuum permittivity, $\varepsilon_{AlGaN}$ is a permittivity of a gate barrier layer, d is a thickness of the barrier layer, namely, a distance from the two-dimensional electron gas to a surface of a sample). The AC modulation signal keeps the resonance frequency of the plasmon changing. FIG. 5 shows curves of dispersion relationships of the plasmon and free space terahertz wave.

In FIG. 5, the dashed lines represent resonances of the plasmon and the cavity mode, that is, the resonance absorption of the plasmon occurs. A Fabry-Pérot (F-P) cavity mode is related to a refractive index $\bar{n}$ and a thickness D of the cavity dielectric, and the resonant frequency thereof is $$\omega_c = k\frac{\pi c}{\bar{n}D},$$

k=1, 2, 3, . . . .

Figure 6:
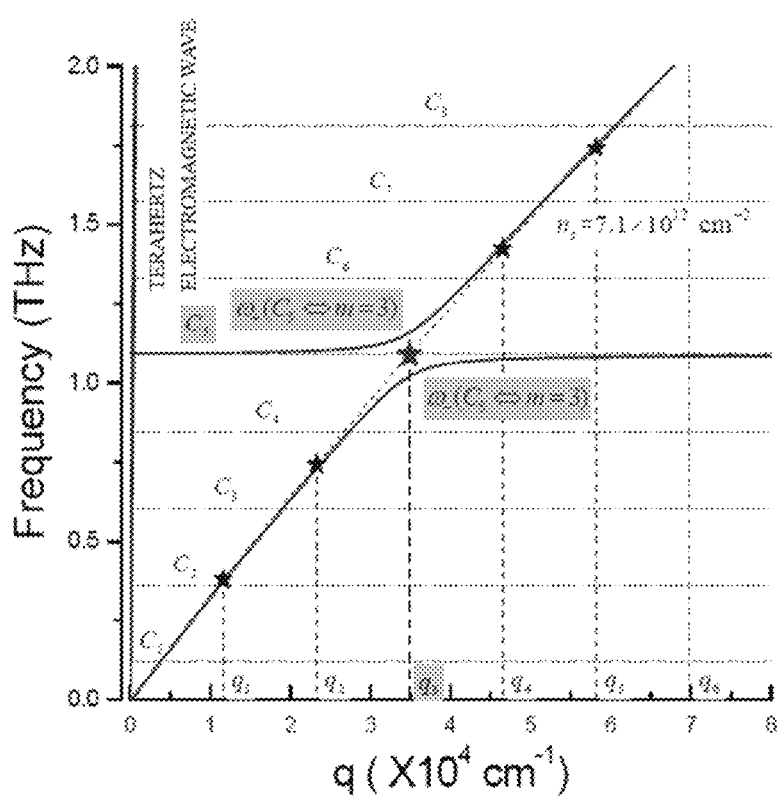
FIG. 6 shows curves of two branches $\omega_+$ and $\omega_-$ of a plasmon polariton formed by strong coupling of the plasmon and a cavity mode.
Figure 7:
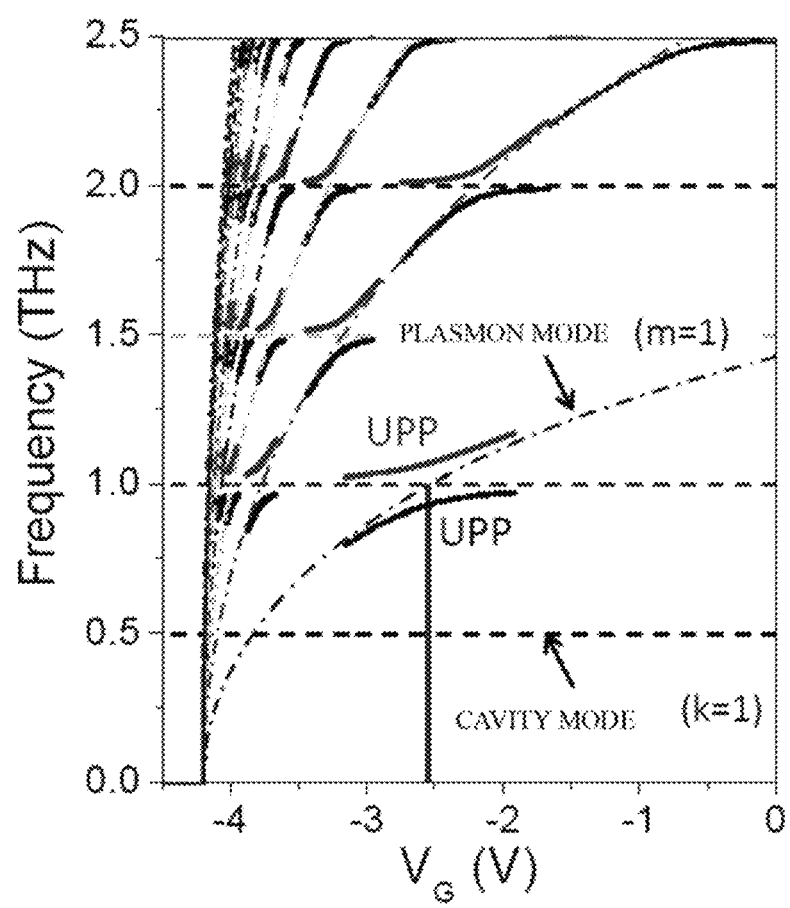
FIG. 7 shows a calculated eigenmode of the plasmon polariton.

Referring to FIG. 6, when the plasmon and the cavity mode are strongly coupled through resonance, two branches of the plasmon polariton will appear, namely, $\omega_+$ and $\omega_-$ as shown in FIG. 6. As shown in FIG. 7, a strong coupling eigenmode of a structure is calculated. FIG. 7 identifies an upper branch and a lower branch of a certain plasmon polariton (m=1, k=2), and a vertical straight line identifies a DC gate voltage corresponding to a resonance coupling point of the plasmon and the cavity mode, which is about −2.5V.

When tuned by gate voltage, the electron concentration of the two-dimensional electron gas is actually changed, so that a resonance occurs between a gate-controlled plasmon and the cavity mode, and the cavity mode which has been a transmission peak will be absorbed by plasmon resonance. Hence when the gate voltage is switched between the resonance and non-resonance conditions, an effective modulation on the cavity mode is achieved. This is the basic operation principle of the terahertz modulator of the present disclosure.

Figure 8:
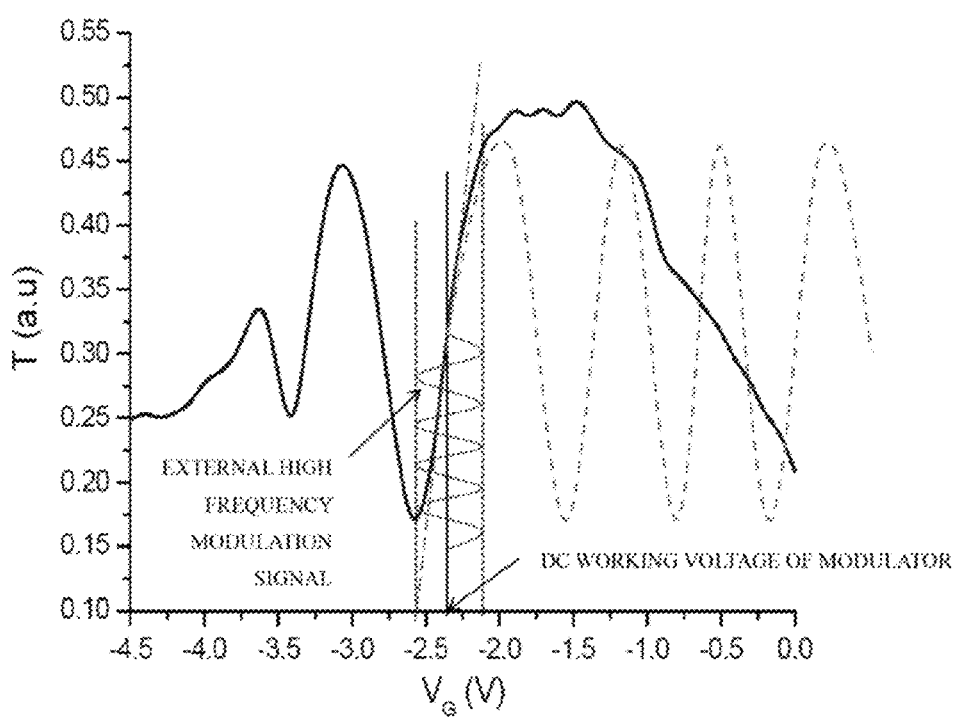
FIG. 8 shows the measured dependence of a cavity mode of 1.07 THz on the gate voltages.

A low-temperature time domain transmission spectrum of the device proves that the device is highly potential as a terahertz modulator. To further formulate the modulation method, FIG. 8 shows the biasing configuration during the operation of the device. The minimum transmission of the cavity mode is present at the resonance condition, and when an external modulation signal adjusts the gate voltage to the non-resonance condition, a maximum transmission of the cavity mode is achieved. FIG. 8 identifies a DC working voltage of the device and an optimal applied high frequency modulation signal. FIG. 8 shows the dependence of a transmission coefficient of the cavity mode on the gate voltage, when a carrier frequency of 1.07 THz is measured through experiment. FIG. 8 identifies the DC working voltage of the device and the applied high frequency modulation signal, and it can be seen from FIG. 8 that the transmittance varying along with the gate voltage has an excellent linearity near the resonance frequency, that is, the transmittance varies along with the gate voltage in a linear relationship. The waveform "similar to sine wave" as indicated by the dashed line in FIG. 8 represents the modulated terahertz wave transmission coefficient, and the amplitude modulation depth thereof is $\eta_{1.07THz}$=66%. The obtained modulation depth is higher than all the terahertz modulator performances disclosed in the prior art.

Figure 9:
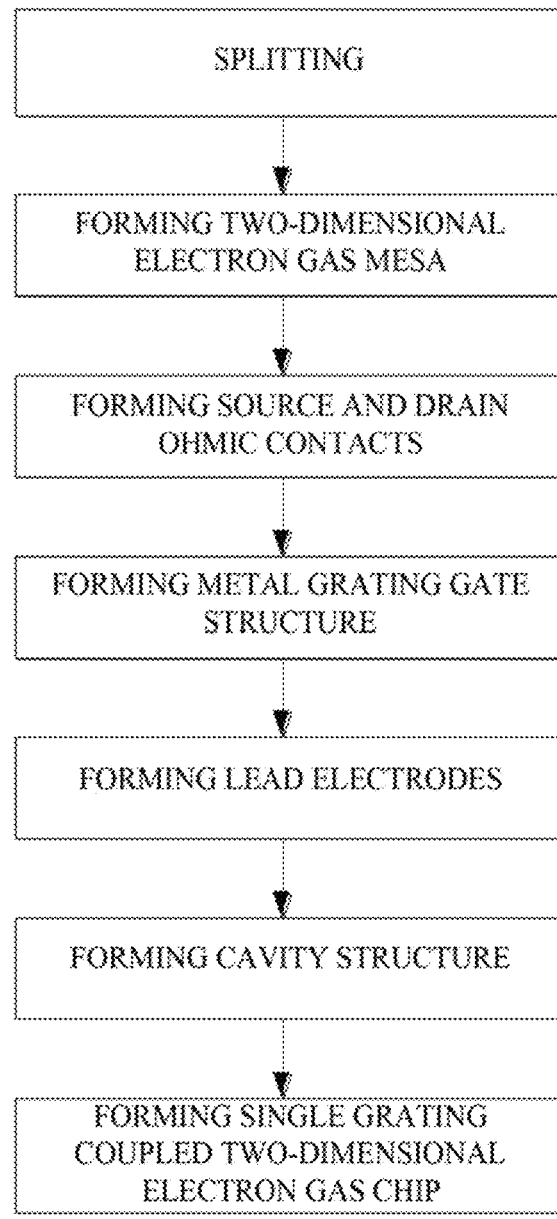
FIG. 9 is a flow chart of manufacturing the terahertz modulator of the present disclosure.

Referring to FIG. 9, the present disclosure further proposes a method of manufacturing the terahertz modulator, including:
I. forming a two-dimensional electron-gas mesa of an active region of the device on a GaN/AlGaN two-dimensional electron-gas die;
II. forming source and drain ohmic contacts;
III. forming a grating gate;
IV. forming lead electrodes of grating gate and ohmic contact and pattern transfer for wafer bonding;
V. thinning and polishing the back side of the sapphire substrate to form a cavity structure.

Figure 10:
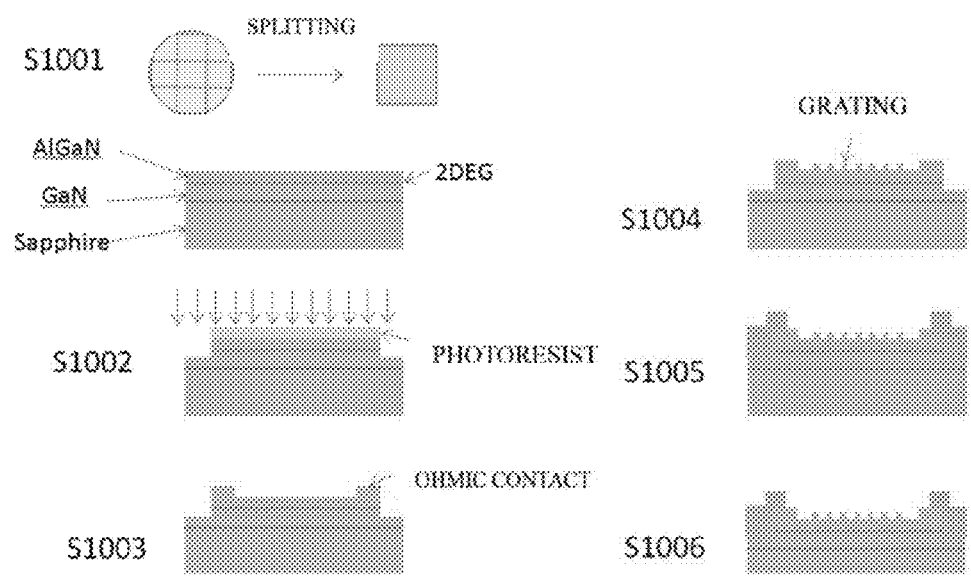
FIG. 10 is a specific flow chart of a manufacturing process of a basic terahertz modulator structure.

Based on the technical idea of FIG. 9, FIG. 10 shows a more specific flow chart of a manufacturing process of a terahertz modulator, which is suitable for mass production, and the details are as follows:

S1001. Splitting: a 2 inch GaN/AlGaN two-dimensional electron-gas wafer is divided into square dies of 1.5 cm by 1.5 cm by using laser scribing machine.

S1002. Forming a two-dimensional electron-gas mesa: pattern transfer of the two-dimensional electron-gas mesa is achieved by using a UV exposure technology (referred to as lithography), thereafter, two-dimensional electron-gas materials are etched by using an inductive coupled plasma (ICP) in order to form a device active region mesa.

S1003. Ohmic contact: lithography, thereafter, adopts the electron beam evaporation process to evaporate the multi-layer metal structure of ohmic contact on the two-dimensional electron-gas mesa, and an ohmic contact metal pattern is formed after lift-off process. Ti/Al/Ni/Au (20/120/70/100 nm) are generally used for the GaN/AlGaN HEMT. Lastly, in a nitrogen atmosphere in a rapid annealing furnace, an annealing is performed for 30 seconds at 900° C. to form the source and drain ohmic contacts.

S1004. Grating gate: lithography is performed to achieve a pattern transfer of the grating structure, evaporating and depositing Ti/Au or Ni/Au (20/100 nm) by using electron beams, and the metal grating gate structure is formed after lift-off process.

S1005. Lead electrode: lithography is performed, achieving a lead electrode of the grating gate, an ohmic contact lead electrode and a pattern transfer for wafer bonding. Evaporating and depositing Ti/Au or Ni/Au (20/300 nm) by using electron beams, a corresponding electrode structure is formed after lift-off process.

S1006. Polishing the substrate cavity by using a thinning machine or a chemical machine, performing thinning and polishing from the back side of the sample to form a cavity structure, the thickness of the thinned cavity is usually in the range of 100-200 μm.

Lastly, a single grating coupled two-dimensional electron-gas chip is formed through splitting, wherein a square die of 1.5 cm by 1.5 cm is divided into independent two-dimensional electron-gas prototype chips with a size of about 6×6 mm² by using laser scribing and manual dissociation.

As mentioned above, FIG. 3 shows another specific structure in addition to the most fundamental substrate cavity structure, which is a terahertz modulator having symmetrical dielectric cavities, and two symmetrical cavities "share" one plasmon system, that is, another cavity 10 is symmetrically provided on a two-dimensional electron-gas chip eventually manufactured in the flow of FIG. 10, and the cavity 10 and cavity of the two-dimensional electron-gas chip "share" one plasmon system. Thus, the present disclosure further provides embodiments on the method of manufacturing the terahertz modulator having the different cavity.

The method of manufacturing the terahertz modulator having symmetrical dielectric cavities is as follows:
a dielectric cavity can be further provided based on the typical terahertz modulator of FIG. 1 in order to form the terahertz modulator having the symmetrical dielectric cavities as shown in FIG. 3. The manufacturing method includes steps of manufacturing a dielectric cavity 10 and bonding the dielectric cavity and the two-dimensional electron-gas chip together, and the aforementioned dielectric cavity refers to the dielectric cavity 10 symmetrical to the two-dimensional electron-gas chip. The steps of manufacturing the dielectric cavity mainly include:
1) thinning and polishing the cavity flat plate material (sapphire) by using the thinning machine and a chemical-mechanical polishing process;

2) performing lithography and achieving pattern transfer of a wafer bonding region on the cavity flat plate material, wherein the Ti/Au or Ni/Au (20/300 nm) can be evaporated and deposited by using electron beams to form a chip bonding metal region;

3) performing lithography and achieving transfer of a flip-chip bonding pattern in the bonding metal region, wherein the indium can be deposited through thermal evaporation, and a required flip-chip bonding indium cylinder can be obtained through lift-off process;

lastly, the dielectric cavity manufactured through the above steps and the two-dimensional electron-gas chip eventually manufactured through the steps in FIG. 10 are bonded together by using a flip-chip welding technology, thereby forming the terahertz modulator having symmetrical dielectric cavities.

Wherein the step of performing pattern transfer of the wafer bonding region on the cavity flat plate material is achieved by evaporating and depositing the Ti/Au or Ni/Au by using electron beams and forming the chip bonding metal region through lift-off process.

The step of performing transfer of the flip-chip bonding pattern in the bonding metal region is achieved by depositing the indium through thermal evaporation and obtaining the required flip-chip bonding indium cylinder through lift-off process.

The step of bonding the two-dimensional electron-gas chip and the dielectric cavity together includes: the bonding can be achieved through the flip-chip welding technology, that is, the two-dimensional electron gap chip and the dielectric cavity are aligned in a positional relationship as shown in FIG. 3, and, after being heated, are pressed together through gold-indium solid solution, and are eventually refluxed in a reflow oven in order to further solidify the bonding.

The present disclosure is advantageous in the following aspects:

1) the plasma wave and the terahertz cavity mode are in a strong coupling state, and the plasma wave represents the collective oscillation of electrons (extremely fast collective response), and thus the modulator is advantageous in its large modulation depth and high modulation speed;

2) the electron concentration of the two-dimensional electron gas is relatively high in the GaN/AlGaN heterostructure, hence a broader terahertz band can be covered through gate control;

3) although the device is operated in a narrow band, it can be operated in a plurality of frequency points, and the operation frequency point and voltage can be designed according to the theory and demands, and thus the flexibility of the device is relatively high;

4) when the quality factor of the plasmon is high, the amplitude of the modulation signal required when operating the modulator is relatively small, which is in favor of high speed application and reducing power dissipation;

5) the sapphire substrate itself absorb a very small amount of terahertz wave, hence the dissipation thereof is smaller than a doped semiconductor;

6) the sapphire substrate is very hard, and thus the device will not be damaged and will have enough mechanical strength even if it is thinned to a thickness of 100-200 μm.

Based on above, compared with the technical solution of single electron behavior in the prior art, the present disclosure discloses the resonance absorption mechanism caused by collective oscillation of electrons (plasma wave, namely, the plasmon), In order to enhance a coupling strength between the terahertz wave and the plasmon, an HEMT (high electron mobility transistor) structure having grating coupled two-dimensional electron gas is integrated in the terahertz cavity. The strong coupling effect results in the smallest transmission coefficient of the cavity mode at the resonance condition, and the resonance condition of the plasmon and the cavity mode is tuned through the change of the grating gate voltage, to achieve the manipulation of the terahertz wave transmission. When the oscillation frequency of the plasmon is tuned to allow the system to switch between the non-resonance and resonance conditions, an effective modulation on the cavity resonance mode can be achieved. The present disclosure specifies both the physical mechanism of the terahertz modulator and the process technology for achieving the terahertz modulator, and renders a possible solution for relevant applications. Since a strong coupling of "light" (terahertz wave) and "matter" (plasmon) is adopted, the present disclosure possesses prominent substantive features, and represents notable progress.

The above-mentioned specific embodiments are provided in order for the purpose, technical solution and advantageous effects of the present disclosure to be understood. It should be understood that, the above contents are only the embodiments of the present disclosure, which are not used to limit the protection scope of the present disclosure. Any modifications, equal substitutions and improvements made within the spirit and principle of the present disclosure shall fall within the protection scope of the claims of the present disclosure.

What is claimed:

1. A terahertz modulator based on low-dimension electron plasma wave, comprising a plasmon and a cavity; wherein
   the plasmon comprises:
   a GaN/AlGaN high electron mobility transistor, comprising: a source electrode, a drain electrode and a single grating gate;
   a quasi-two-dimensional electron layer formed on the side of a narrow bandgap semiconductor at a semiconductor heterojunction of the transistor, for exciting plasma wave, and
   the cavity comprises a dielectric cavity formed from a surface where a grating contacts with a device, which represents the modulator, to a lower surface of a thinned sapphire substrate.

2. The terahertz modulator of claim 1, wherein the single grating gate is a one-dimensional grating or an interdigital grating.

3. The terahertz modulator of claim 1, wherein the cavity is a Fabry-Pérot cavity formed by interfaces of a thinned the device itself.

4. The terahertz modulator of claim 1, wherein the single grating gate is any one of a planar two-dimensional grid grating, a concentric circular grating, and a terahertz metamaterial grating.

5. The terahertz modulator of claim 1, wherein the cavity is a cavity coplanar with the two-dimensional electron gas.

6. The terahertz modulator of claim 1, wherein the quasi-two-dimensional electron layer refers to electrons in a semiconductor two-dimensional electron channel, and the resonance absorption of the terahertz wave is achieved by exciting the collective oscillation of the electrons, and the absorption is further enhanced through a strong coupling with the cavity mode.

7. The terahertz modulator of claim 1, wherein the terahertz modulator further comprises a symmetrical cavity structure constituted by identical dielectric layers.

8. A method of manufacturing the terahertz modulator, including
- step I. forming a two-dimensional electron-gas mesa of an active region of a device on a GaN/AlGaN two-dimensional electron-gas die;
- step II. forming source and drain ohmic contacts;
- step III. forming a grating gate;
- step IV. forming lead electrodes of the grating gate and the ohmic contact and a pattern transfer for wafer bonding; and
- step V. thinning and polishing the back side of a sapphire substrate to form a cavity structure.

9. The method of manufacturing the terahertz modulator of claim 8, wherein in step I, the GaN/AlGaN two-dimensional electron-gas die refers to a square die of 1.5 cm by 1.5 cm obtained by dividing a 2 inch GaN/AlGaN two-dimensional electron-gas wafer by using a laser scribing machine; and the pattern transfer of the two-dimensional electron-gas mesa is achieved by using a UV lithography process, thereafter, the two-dimensional electron-gas material is etched by using an inductively coupled plasma in order to form an active region mesa of the device.

10. The method of manufacturing the terahertz modulator of claim 8, wherein step II further includes lithography, which is followed by adopting the electron beam evaporation process to evaporate the multilayer metal structure of the ohmic contact on the two-dimensional electron-gas mesa, forming an ohmic contact metal pattern after lift-off process, and placing the formed pattern in a rapid annealing furnace for annealing to form source and drain ohmic contacts.

11. The method of manufacturing the terahertz modulator of claim 8, wherein the forming the grating gate in step III includes lithography, which is followed by evaporating and depositing Ti/Au or Ni/Au by using electron beams, and forming a metal grating gate structure after lift-off process; wherein in step IV, the lithography is performed first, then the Ti/Au or Ni/Au is evaporated and deposited by using electron beams, and the corresponding electrode structure is formed after lift-off process.

12. The method of manufacturing the terahertz modulator of claim 8, wherein the sample substrate is thinned by using a thinning machine and polished by using a chemical machine to form the cavity structure.

13. The method of manufacturing the terahertz modulator of claim 8, wherein a step of laser scribing and manual dissociation is performed after step V to form a single grating coupled two-dimensional electron-gas chip through splitting.

14. A method of manufacturing a terahertz modulator with a symmetrical dielectric cavity, including steps of manufacturing a dielectric cavity and bonding the dielectric cavity and a two-dimensional electron-gas chip together, wherein the manufacturing the dielectric cavity includes:
- thinning and polishing a cavity flat plate material;
- performing pattern transfer of a wafer bonding region on the cavity flat plate material; and
- achieving transfer of a flip-chip bonding pattern in the bonding metal region.

15. The method of manufacturing the terahertz modulator with the symmetrical dielectric cavity of claim 14, wherein the performing pattern transfer of the wafer bonding region on the cavity flat plate material is achieved by evaporating and depositing the Ti/Au or Ni/Au by using electron beams and forming the chip bonding metal region through lift-off process.

16. The method of manufacturing the terahertz modulator with the symmetrical dielectric cavity of claim 14, wherein the transfer of the flip-chip bonding pattern in the bonding metal region is achieved by thermal evaporating and depositing the indium and obtaining a required flip-chip bonding indium cylinder through lift-off process.

17. The method of manufacturing the terahertz modulator with the symmetrical dielectric cavity of claim 14, wherein the bonding of the dielectric cavity and the two-dimensional electron-gas chip together includes: aligning the dielectric cavity and the two-dimensional electron-gas chip, applying pressure after heating, bonding together through gold-indium solid solution, and eventually being refluxed in a reflow oven.

18. The method of manufacturing the terahertz modulator of claim 9, wherein the sample substrate is thinned by using a thinning machine and polished by using a chemical machine to form the cavity structure.

19. The method of manufacturing the terahertz modulator of claim 9, wherein a step of laser scribing and manual dissociation is performed after step V to form a single grating coupled two-dimensional electron-gas chip through splitting.

* * * * *